United States Patent
Fritschy et al.

(10) Patent No.: US 8,414,244 B2
(45) Date of Patent: Apr. 9, 2013

(54) FEEDER DEVICE FOR INSERTION MACHINES OF PRINTED CIRCUIT BOARDS

(75) Inventors: Hugo Fritschy, Sachseln (CH); Arnold Teimel, Giswil (CH)

(73) Assignee: Maxon Motor AG, Sachseln (CH)

( * ) Notice: Subject to any disclaimer, the term of this patent is extended or adjusted under 35 U.S.C. 154(b) by 0 days.

(21) Appl. No.: 12/299,162

(22) PCT Filed: May 24, 2007

(86) PCT No.: PCT/EP2007/004637
§ 371 (c)(1),
(2), (4) Date: Dec. 17, 2008

(87) PCT Pub. No.: WO2007/137766
PCT Pub. Date: Dec. 6, 2007

(65) Prior Publication Data
US 2010/0284769 A1 Nov. 11, 2010

(30) Foreign Application Priority Data

May 26, 2006 (DE) .......................... 10 2006 024 733

(51) Int. Cl.
*B65G 1/00* (2006.01)
(52) U.S. Cl. ................ 414/332; 414/416.05; 414/416.06
(58) Field of Classification Search ............. 414/416.05, 414/416.06; 221/25; 226/128
See application file for complete search history.

(56) References Cited

U.S. PATENT DOCUMENTS

| | | | | |
|---|---|---|---|---|
| 4,731,554 A | * | 3/1988 | Hall et al. | 310/67 R |
| 4,928,029 A | * | 5/1990 | Wright | 310/89 |
| 5,172,021 A | * | 12/1992 | Takahashi et al. | 310/90.5 |
| 5,946,161 A | * | 8/1999 | Schuh | 360/97.03 |
| 5,949,681 A | | 9/1999 | Asai et al. | |
| 6,379,098 B1 | | 4/2002 | Shibasaki | |
| 6,474,527 B2 | * | 11/2002 | Miller | 226/32 |

(Continued)

FOREIGN PATENT DOCUMENTS

| | | |
|---|---|---|
| DE | 101 57 230 A1 | 10/2002 |
| DE | 102 24 998 A1 | 1/2004 |

(Continued)

OTHER PUBLICATIONS

An English Translation of the Office Action (Notification of the Reasons for Rejection) dated Feb. 22, 2011, issued in the corresponding Korean Patent Application No. 10-2008-7030014.

(Continued)

*Primary Examiner* — Saul Rodriguez
*Assistant Examiner* — Willie Berry, Jr.
(74) *Attorney, Agent, or Firm* — Buchanan Ingersoll & Rooney PC

(57) ABSTRACT

The invention relates to a feeder device (1) for insertion machines for printed circuit boards, comprising a housing, a drive motor (3, 3'), a gear unit (5) and a pin wheel (6) engaging with a transport tape. The drive motor and the gear unit are arranged on a common side wall (2) of the housing such that the axles thereof are perpendicular to the side wall. It is the object of the invention to provide a narrow structural design of the feeder device, which also allows easy mounting. To this end, the rotor (14, 14') of the drive motor (3) is rotatably mounted on only one axle (4, 4') which is fixedly connected to the side wall (2) of the housing.

18 Claims, 3 Drawing Sheets

U.S. PATENT DOCUMENTS

| | | | |
|---|---|---|---|
| 7,137,263 B2 * | 11/2006 | Collins et al. | 62/180 |
| 7,220,095 B2 * | 5/2007 | Lyndaker et al. | 414/810 |
| 7,380,581 B2 * | 6/2008 | Ricketson | 156/750 |
| 2002/0062927 A1 | 5/2002 | Hwang et al. | |
| 2003/0226873 A1 | 12/2003 | Liebeke et al. | |
| 2005/0096781 A1 | 5/2005 | Sumida et al. | |
| 2006/0162868 A1 * | 7/2006 | Ricketson | 156/584 |

FOREIGN PATENT DOCUMENTS

| | | |
|---|---|---|
| EP | 0 897 258 B1 | 4/2002 |
| EP | 1 324 648 A1 | 7/2003 |
| EP | 1 534 056 A2 | 5/2005 |
| JP | 09-252193 | 9/1997 |
| JP | 11-171378 A | 6/1999 |
| JP | 2001-044688 | 2/2001 |
| JP | 2001-244691 | 9/2001 |
| WO | 11-171378 A | 6/1999 |
| WO | WO 03/056387 A1 | 7/2003 |
| WO | WO 03/071847 | 8/2003 |

OTHER PUBLICATIONS

An English Translation of the Notice of Reasons for Rejection dated Jul. 6, 2010, issued in the corresponding Japanese Patent Application No. P2009-511416.

Official Action issued in priority German Patent Application No. 10 2006 024 733.7, May 26, 2006, German Patent and Trademark Office, Munich, DE.

Form PCT/ISA/210 (International Search Report) dated Oct. 11, 2007.

* cited by examiner

FEEDER DEVICE FOR INSERTION MACHINES OF PRINTED CIRCUIT BOARDS

RELATED APPLICATION

This application claims priority to PCT/EP2007/004637, which was filed as an International Application on May 24, 2007 designating the U.S., and which claims priority to German Application 102006024733.7 filed in Germany on May 24, 2006. The entire contents of these applications are hereby incorporated by reference in their entireties.

FIELD

The invention relates to a feeder device for insertion machines for printed circuit boards, comprising a housing, a drive motor, a gear unit and a pin wheel engaging with a transport tape, said drive motor and said gear unit being arranged on a common side wall of the housing such that the axles thereof are perpendicular to the side wall, the stator being secured directly to the side wall of the housing and said side wall of the housing defining simultaneously the side wall of the drive motor.

BACKGROUND

Insertion machines are used for positioning electronic components on a printed circuit board. The electronic components are arranged on a transport tape consisting of cardboard or plastic material, and they are covered by another tape. The transport tape is wound into a roll and inserted in a feeder. The transport tape has holes on at least one side thereof, said holes being engaged by a pin wheel which is driven by a drive motor and which thus moves the transport tape. The cover sheet is peeled off simultaneously so that the electronic components are exposed. The electronic components are positioned precisely at a transfer location by means of the pin wheel, removed by a vacuum pipette and placed onto the printed circuit board.

Since the electronic components become increasingly smaller in size and since the number of electronic components on a printed circuit board increases continuously, modern insertion machines must offer space for the highest possible number of feeder devices with transport tapes carrying the electronic components. In order to save space, the individual feeder devices must be as narrow as possible.

It is known to use slim motors as drive motors whose axles extend parallel to the side walls of the feeder device. Hence, such a conventional cylindrical drive must have a very small diameter, i.e. the torque that can be generated by said cylindrical drive will only be very low and, consequently, a high gear reduction will be necessary.

It is also known to use flat motors as drive motors whose axles extend perpendicular to the side walls of the feeder device. These flat motors of the internal- or external-rotor type are able to provide a substantially higher torque on the basis of a small overall height.

Such a feeder device is known e.g. from European patent EP 0 897 258 B1. This patent specification describes a feeder device comprising a tape feeding unit which is secured to a main frame and which is driven by an electric motor that is secured to said main frame as well. The tape feeding unit advances the transport tape with the electronic components while the cover sheet is removed simultaneously. At a transfer position, an electronic component is sucked up by a vacuum pipette and placed onto a printed circuit board. The drive motor is preferably a pulse motor through which the electronic components on the transport tape can be positioned precisely at the transfer position. This can be accomplished e.g. by varying the number of pulses or the pulse duration of the pulse motor.

Also the German patent application DE 101 57 230 A1 describes a feeder device for an insertion machine. The feeder device comprises a main frame having arranged thereon a transport tape feeding unit, a separator in which the cover sheet is separated from the transport tape and a recovery unit in which the cover sheet is wound up. The feeding unit, the separator and the recovery unit are driven via a disk element which is fixedly attached to one side of the main frame and which has arranged thereon a plurality of armature coils. A shaft is rotatably supported in the middle of this first disk element. The shaft has secured thereto a second disk element which is connected to a circular permanent magnet means. Due to the interaction between the permanent magnet means and the armature coils, the shaft is rotated. The rotary movement is transmitted to the feeding unit, the separator and the recovery unit.

Another feeder device for an insertion machine is disclosed in U.S. Pat. No. 6,379,098 B1. The feeder device comprises a first drive motor for advancing the transport tape and a second drive motor which drives a mechanism for peeling the cover sheet off from the transport tape. The first drive motor includes a cylindrical stator which is fixedly secured to the frame of the feeder device. A hollow cylindrical rotor surrounds the stator whereby an air gap is formed between the rotor and the stator. The rotor includes a hollow cylindrical permanent magnet with a gear formed at the back of said permanent magnet. This gear meshes with four additional gears by means of which the rotor is held in position.

These feeder devices known from the prior art are disadvantageous insofar as the thickness of the feeder devices is determined by the length of the drive motors as well as by the thickness of the housing walls of the motor and of the feeder device. In the case of the feeder device described in U.S. Pat. No. 6,379,098 B1 attempts are made to remedy this drawback by providing a shaftless drive motor and by supporting the rotor by means of four gears. This makes the assembly of the system comparatively complex.

SUMMARY

It is therefore the object of the present invention to provide a feeder device which has a thickness that can be reduced still further and a simple structural design and which can therefore be assembled easily.

To this end, the present invention is so conceived that the rotor of the drive motor is rotatably mounted on only one axle which is fixedly connected to the side wall of the housing.

Due to the fact that the rotor of the drive motor is mounted on an axle in the side wall of the housing, the base plate of the motor with bearings can be dispensed with. The thickness can thus be reduced still further. Since the rotor is mounted on only one axle, easy assembly will be possible. The rotor is given its tilt stability in that the axle penetrates the side wall completely or along a section thereof which is as long as possible. The rotor can be mounted on the axle by a plain bearing or by an antifriction bearing.

According to an advantageous embodiment, a sleeve is provided in the side wall of the housing, the axle of the drive motor being press-fitted in said sleeve. The area which is available for supporting the axle is enlarged in this way. The tilt stability of the axle is thus increased still further. In this connection, it will also be advantageous when the sleeve is provided with a support flange with which said sleeve abuts on the side wall.

In order to allow the sleeve to be fixedly held in the side wall of the housing, it will be advantageous to press-fit the sleeve into the side wall of the housing.

According to another embodiment, the side wall of the housing can comprise additional holes in which the gear unit axles are arranged. The thickness of the feeder device can be reduced also in this way. Mounting inaccuracies caused when separate components are attached to the side walls can be avoided by supporting the rotor axle and the gear unit axles in the side wall of the housing.

According to another variant of the invention, the pin wheel has arranged thereon an encoder for positioning the transport tape. A very high positioning accuracy of the feeder can be achieved in this way.

According to an advantageous embodiment, the encoder can be implemented as an incremental rotary encoder whose number of pulses is identical with the number of transfer positions.

The invention can also be so conceived that the encoder on the pin wheel is an incremental rotary encoder whose number of pulses is sufficiently large for a servo operation of the drive motor and a precise positioning of the pin wheel. Hence, only one sensor system is required.

It will also be of advantage when an additional encoder system is provided, which need not necessarily be based on the same physical principle (optical, inductive, capacitive) as the incremental encoder. This additional encoder system can be used for producing a reference pulse for determining the absolute position.

Alternatively, the encoder can also be an absolute rotary encoder which, after having been switched on, provides at any time the absolute position with an accuracy that is adequate for satisfying the requirements in question.

According to another variant, an incremental rotary encoder is provided in addition to the absolute rotary encoder. The absolute rotary encoder can then be used for determining the angular position of the pin wheel, while the incremental rotary encoder can be used for positioning the pin wheel.

To this end, it will be of advantage when the number of pulses of the incremental rotary encoder is identical with the number of transfer positions. It is, however, also possible to provide a number of pulses of the incremental rotary encoder which is sufficiently large for a servo operation of the drive motor and a precise positioning of the pin wheel.

The invention can also be so conceived that additional mechanical transmission elements are provided, which connect the drive motor to a cover sheet arranged on the transport tape. Hence, only one drive motor will be necessary for moving the transport tape and for peeling off the cover sheet arranged on said transport tape.

It will be expedient when the encoder is able to access a correction table having stored therein geometric deviations of individual teeth of the pin wheel which have been ascertained during a calibration process. This will allow an exact positioning of the pin wheel at the transfer positions.

DESCRIPTION OF THE DRAWINGS

In the following, an embodiment of the present invention will be explained in detail making reference to a drawing, in which.

DETAILED DESCRIPTION

Figure 1:
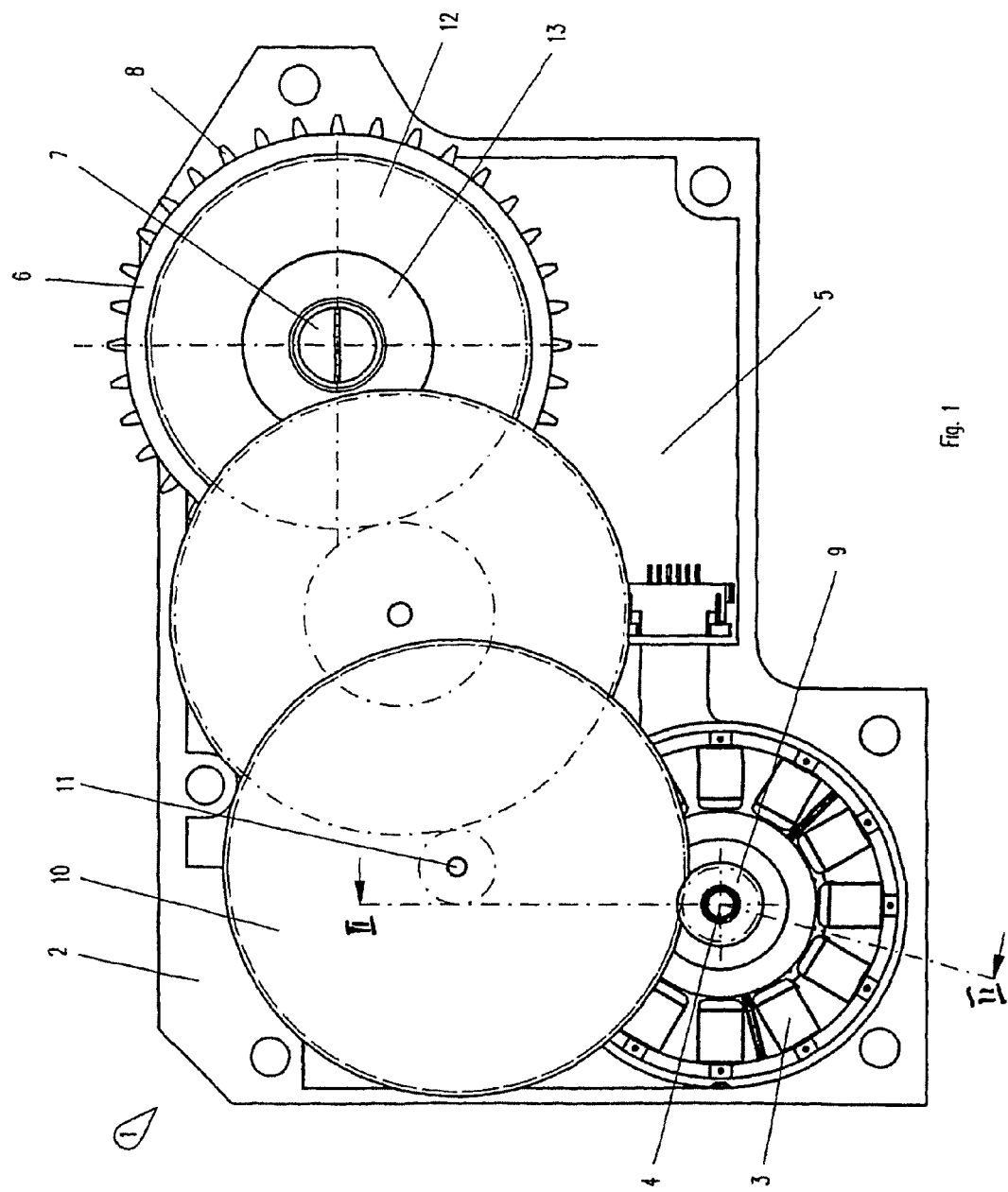
FIG. 1 shows a side view of a feeder device.

FIG. 1 shows a side view of a feeder device 1. The feeder device 1 is provided with a housing having a side wall 2. The side wall 2 has secured thereto a flat motor 3. For reducing the thickness of the feeder device 1, the flat motor 3 is secured to the housing of the feeder device 1 in such a way that the rotor axle 4 of the flat motor 3 extends perpendicular to the housing wall 2.

The flat motor 3 can be used for driving a transport tape having arranged thereon electronic components which are provided by the feeder for placement on a printed circuit board. The flat motor 3 can, however, also serve to peel a cover sheet, which is arranged on the transport tape and which protects the electronic components, off from the transport tape so that the electronic components can be accessed. The feeder device is, for this purpose, provided with suitable transmission elements which transmit the movement of the flat motor to the cover sheet. It is also possible that the flat motor 3 fulfills both functions. In this case, the flat motor fulfills the function of driving the transport tape as well as that of peeling off the cover sheet, an additional motor can be dispensed with.

In the following, it will be described that the flat motor 3 is used as a drive for the transport tape.

In this case, the flat motor 3 is connected to the pin wheel 6 via a gear unit 5. Also the pin wheel 6 is supported on an axle 7 that extends perpendicular to the side wall 2. The transport tape is driven via the pin wheel 6. The circumference of the pin wheel 6 is provided with teeth or pins 8 for this purpose. The transport tape is provided with openings along at least one edge thereof, similar to a film for a camera. The pins 8 of the pin wheel 6 engage these openings of the transport tape and entrain the transport tape.

The rotor 14 of the flat motor 3 has a gear 9 provided thereon. The gear 9 is in mesh with a gear 10 of the gear unit 5. The gear 10 is mounted on a gear unit axle 11 which, too, extends perpendicular to the side wall 2. Depending on the transmission ratio required, the gear unit 5 comprises additional gears mounted on gear unit axles that extend perpendicular to the side wall. Also the axle 7 of the pin wheel 6 has a gear 12 attached thereto. The last stage of the gear unit 5 is in engagement with this gear 12 and transmits the power of the drive motor 3 to the pin wheel 6.

A position detection system is arranged directly on the pin wheel 6 so that the electronic components arranged on the transport tape can be positioned precisely at the transfer positions for the insertion head. In the embodiment described, the encoder disk 13 of an encoder is provided on the pin wheel 6 for this purpose. The encoder allows the geometric deviation of individual teeth of the pin wheel 6 to be compensated by a calibration process. In this calibration process, the pin wheel 6 is measured by a high-precision reference system and the correction values are stored in a data table.

The encoder system used can be based on an inductive, a capacitive, a magnetic or an optical functional principle. The encoder can be an incremental rotary encoder. The number of pulses of the incremental rotary encoder then correspond to the number of transfer positions at the pin wheel. For synchronizing the encoder signals with a previously established correction table comprising the geometric deviations of the pin wheel, the incremental encoder system makes use of a reference pulse. This reference pulse can selectively be generated by an additional sensor which is based on a functional principle other than that of the incremental encoder. In this respect, it is disadvantageous that, under unfavourable conditions, an almost complete rotation of the pin wheel is necessary until the signal for initializing the association of the position with the correction table is available. In this case, electronic components which are ready for insertion during this rotation would get lost unutilized.

It is also possible to use an encoder system which, on the basis of one or a plurality of additional tracks, provides not only the incremental but also the absolute angular position. In the case of this absolute encoder system, the number of available absolute positions corresponds at least to the number of transfer positions at the pin wheel. This allows a direct association with the correction table at any transfer position. It is therefore no longer necessary to move to a reference point so that a loss of components will no longer occur.

Figure 2:
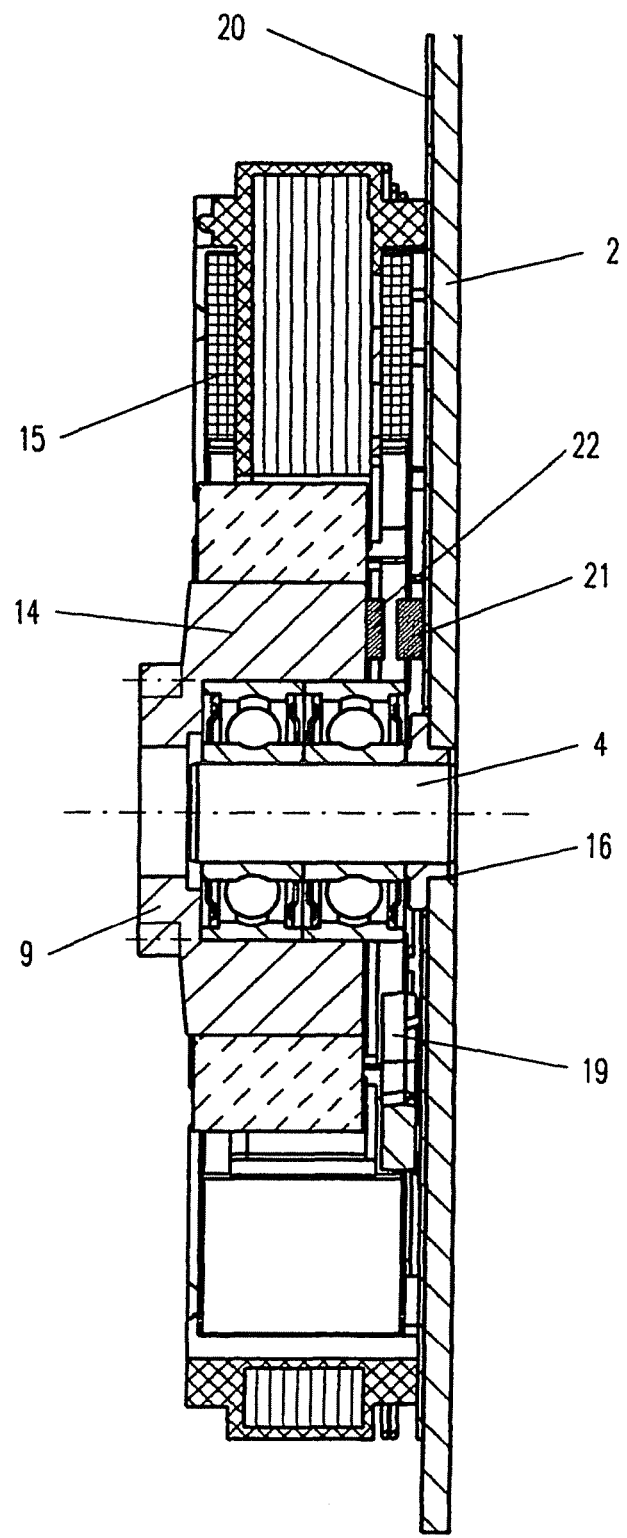
FIG. 2 shows a section through a drive motor for a feeder device, along the line II-II of FIG. 1.

FIG. 2 shows a cross-section through a flat motor 3 which can be incorporated in a feeder device. The motor 3 includes a rotor 14 and a stator 15 which is secured to a base plate. The rotor 14 is mounted on outer rings of ball bearings surrounding the rotor axle 4. The upper side of the rotor 14 has provided thereon the pinion 9 for transmitting the rotation of the rotor to the gear unit. The stator 15 with its winding is arranged on the outer circumference of the rotor 14. This structural design has the advantage that the rotor inertia will be by far lower than that of an external-rotor type arrangement and, consequently, it will be more advantageous when high dynamic requirements have to be fulfilled. For allowing a flat structural design of the feeder device 1, the side wall 2 of the feeder device defines the base plate of the motor 3. A sleeve 16 is press-fitted in the side wall 2 of the housing, and said sleeve 16 has, in turn, press-fitted therein the rotor axle 4 of the flat motor 3. The side wall 2 has, for this purpose, a hole into which the sleeve 16 is press-fitted to such an extent that it abuts on the side wall 2 with a support flange. The rotor 14 is rotatably supported on the rotor axle 4. A rotation of the rotor 14 will thus result in a rotation of the gear 9.

Alternatively, the connection between the rotor axle 4 and the sleeve 16 and the side wall 2, and/or the connection between the sleeve 16 and the side wall 2 can be established by welding, in particular by laser welding.

For determining the position of the rotor 14, sensors 19 are used. The sensors 19 are located below the magnet of the rotor 14 and sense the magnetic field thereof. The sensors can be Hall ICs with a digital output or they can be linear Hall sensors with an analog output. If linear Hall sensors are used, an encoder signal and the commutation signals can be gained through additional electronics consisting of two sensors which are electrically displaced by 90°. The same result can be achieved by a slightly different evaluation electronics comprising three sensors which are electrically displaced by 120°. Furthermore, it is also possible to provide an optical or a magnetic encoder disk 22 on the rotor 14. This encoder disk can be sensed with optical or magnetic sensors 21 which are arranged on the printed circuit board 20, whereby a higher angular resolution can be accomplished. When a magnetic system is used, the Hall sensors 19 produce additional signals for the commutation of the motor.

Contacting of the winding terminals of the stator 15 and the sensors 19 is accomplished through a flat printed circuit board 20, which is preferably flexible so as to achieve the smallest possible overall height and which includes a foil (consisting e.g. of Kapton) that it attached to the side wall 2 as a carrier material.

Figure 3:
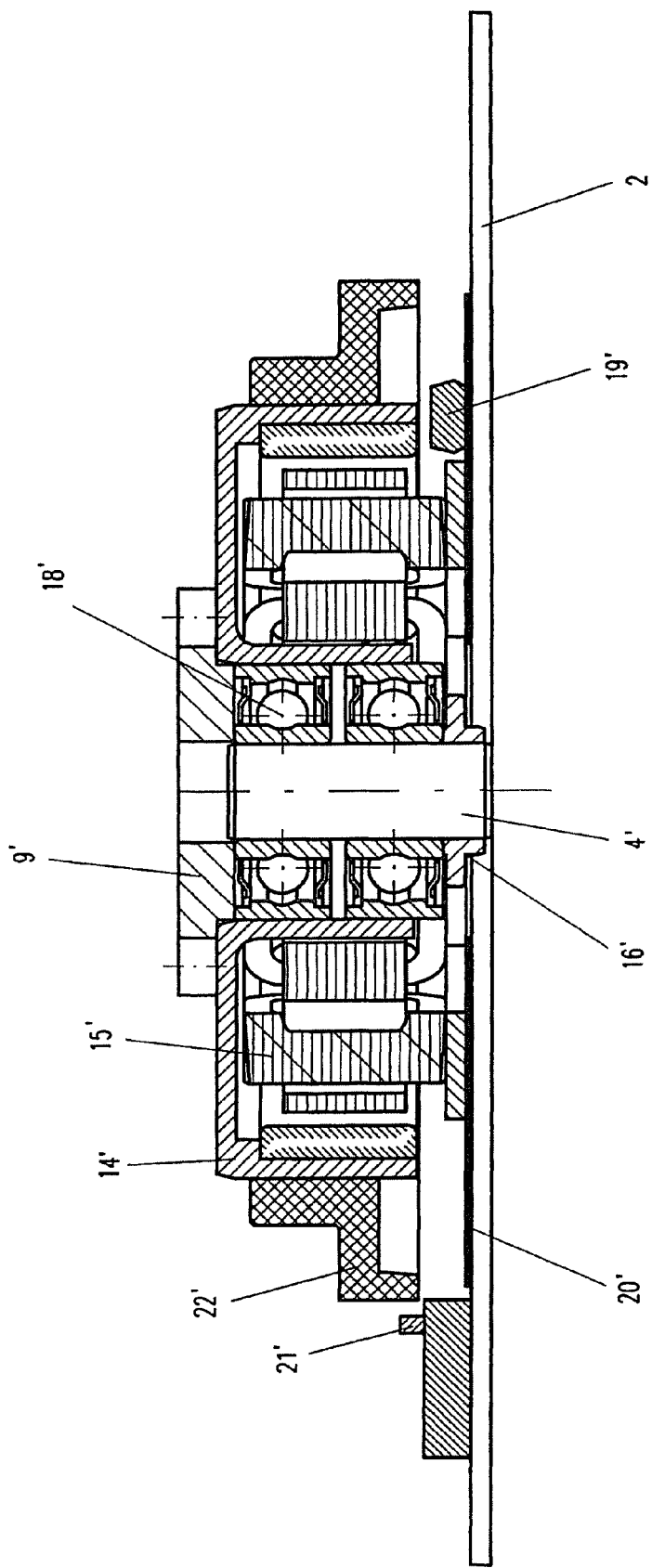
FIG. 3 shows a section through an alternative embodiment of a drive motor along the line II-II of FIG. 1.

FIG. 3 shows an alternative embodiment of a flat motor 3'. In spite of the above-mentioned drawbacks, the flat motor 3' may also be implemented as an external rotor motor. The flat motor 3' comprises again a rotor 14' and a stator 15'. The stator 15' is secured in position on the base plate 2 which simultaneously defines the side wall 2 of the housing. The base plate or side wall 2 is provided with a hole having press-fitted therein a sleeve 16' with a support flange. The rotor axle 4' is, in turn, press-fitted in this sleeve 16'. Alternatively, the rotor axle 4' can be secured in position in the side wall 2 or in the sleeve by welding, e.g. by laser welding. Also the sleeve could be secured in position in the side wall by welding.

Ball bearings 18' are mounted on the rotor axle 4'. The rotor 14' is arranged on the outer rings of the ball bearings 18'.

The rotor 14' is connected to a pinion 9' which transmits the rotary movement of the rotor 14' to the gear unit 5.

The flat motor 3' can also have arranged thereon an additional encoder system. This system can be an optical encoder system in the case of which the code carrier 22' is secured to the rotor 14' and the sensor 21' is secured to the base plate 2.

It is, however, also possible to use a magnetic encoder system. In this case, two or three sensors 19' detect the magnetic field of the rotor 14'. A special electronics converts signals of said sensors 19' into encoder signals for positioning the pin wheel 6 and into signals for the commutation of the flat motor 3'.

Another alternative is a further magnetic encoder system. In this encoder system a special sensor 21' is provided, which detects a separate magnetic code carrier 22' that is secured to the rotor 14'. In addition, Hall sensors 19' are provided on the printed circuit board 20' for the flat motor 3', said Hall sensors producing signals for the commutation of the flat motor 3'.

The encoder system arranged on the rotor 14, 14' can be used for positioning the pin wheel 6 when the motor used is an internal rotor motor 3 and also when it is an external rotor motor 3'. Due to the gear reduction of the gear unit 5, only a lower resolution of the encoder will be necessary for positioning the pin wheel, the requirements to be satisfied by the quality of the encoder system are lower. This encoder system is also used for the servo operation of the motor 3, 3'.

However, also the high-resolution encoder system arranged on the pin wheel 6 can be used for positioning the pin wheel 6.

It is also possible to produce the signals for the commutation of the flat motor via a measurement system integrated in the flat motor, without employing sensors. This measurement system ascertains high-resolution position information from the variable inductance and/or from the back EMF reaction of the flat motor. The measurement system can be integrated in the existing motor control unit. It would also be possible to use the position information ascertained by the measurement system, which is integrated in the flat motor, for positioning the pin wheel. In view of the gear reduction of the gear unit between the flat motor and the pin wheel, a very high resolution can be achieved at the pin wheel.

The side wall 2 is provided with additional holes having gear axles arranged therein. This has the effect that further assembly tolerances are avoided, which would have a negative influence on the precision with which the movement of the motor is transmitted by the gear unit.

The invention claimed is:

1. A feeder device for insertion machines for printed circuit boards, comprising:
    a housing, a drive motor, a gear unit and a pin wheel engaging with a transport tape, wherein said drive motor and said gear unit being arranged on a common side wall of the housing such that axles thereof are perpendicular to the side wall, and wherein the in wheel has arranged thereon a first encoder for positioning the transport tape;

a stator of the drive motor being secured directly to the common side wall of the housing, and said common side wall of the housing defining simultaneously a side wall of the drive motor; and a second encoder for producing a reference pulse for determining an absolute position of the in wheel, wherein a rotor of the drive motor is rotatably mounted on only one axle which is fixedly connected to the common side wall of the housing.

2. The feeder device according to claim 1, wherein the drive motor is a brushless drive motor having a rotor that is permanently excited and positioned within the stator.

3. The feeder device according to claim 2, wherein the fixed connection between the axle and the side wall of the housing is accomplished by a sleeve.

4. The feeder device according to claim 1, wherein the fixed connection between the axle and the side wall of the housing is accomplished by a sleeve.

5. The feeder device according to claim 4, wherein the sleeve is press-fitted in the side wall of the housing.

6. The feeder device according to claim 5, wherein the axle is press-fitted in the sleeve.

7. The feeder device according to claim 4, wherein the axle is press-fitted in the sleeve.

8. The feeder device according to claim 4, wherein the sleeve is provided with a support flange with which said sleeve abuts on the side wall of the housing.

9. The feeder device according to claim 1, wherein a pinion for transmitting torque to a gear unit is secured in position on one side of the rotor of the drive motor.

10. The feeder device according to claim 1, wherein the side wall is provided with additional holes in which gear stage axles are secured in position.

11. The feeder device according to claim 1, wherein the first encoder on the pin wheel is an incremental rotary encoder whose number of pulses is identical with a number of transfer positions.

12. The feeder device according to claim 1, wherein the first encoder on the pin wheel is an incremental rotary encoder whose number of pulses is sufficiently large for a servo operation of the drive motor and a precise positioning of the pin wheel.

13. The feeder device according to claim 1, wherein the first encoder is an absolute rotary encoder which, after having been switched on, provides an absolute position at any time.

14. The feeder device according to claim 13, wherein an incremental rotary encoder is provided in addition to the absolute rotary encoder.

15. The feeder device according to claim 14, wherein a number of pulses of the incremental rotary encoder is identical with a number of transfer positions.

16. The feeder device according to claim 14, wherein a number of pulses of the incremental rotary encoder is sufficiently large for a servo operation of the drive motor and a precise positioning of the pin wheel.

17. The feeder device according to claim 1, wherein additional mechanical transmission elements are provided, which connect the drive motor to a cover sheet arranged on the transport tape.

18. The feeder device according to claim 1, wherein the first encoder is able to access a correction table having stored therein geometric deviations of individual teeth of the pin wheel which have been ascertained during a calibration process.

* * * * *

UNITED STATES PATENT AND TRADEMARK OFFICE
CERTIFICATE OF CORRECTION

PATENT NO. : 8,414,244 B2  
APPLICATION NO. : 12/299162  
DATED : April 9, 2013  
INVENTOR(S) : Hugo Fritschy et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 533 days.

Signed and Sealed this  
Sixth Day of August, 2013

Teresa Stanek Rea  
*Acting Director of the United States Patent and Trademark Office*